(12) United States Patent
Watanabe et al.

(10) Patent No.: US 6,372,665 B1
(45) Date of Patent: Apr. 16, 2002

(54) METHOD FOR FORMING A SEMICONDUCTOR DEVICE

(75) Inventors: Joy Kimi Watanabe; Matthew Thomas Herrick; Terry Grant Sparks; Nigel Graeme Cave, all of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/611,412

(22) Filed: Jul. 6, 2000

Related U.S. Application Data

(63) Continuation of application No. 09/104,849, filed on Jun. 25, 1998, now Pat. No. 6,127,258.

(51) Int. Cl.⁷ .............................................. H01L 21/31
(52) U.S. Cl. ..................................................... 438/780
(58) Field of Search ................................ 438/780, 781, 438/787, 788–789, 791–793, 794, 625, 623–624, 778, 800

(56) References Cited

U.S. PATENT DOCUMENTS

| | | | |
|---|---|---|---|
| 5,269,880 A | 12/1993 | Jolly et al. ................... | 438/701 |
| 5,635,423 A | 6/1997 | Huang et al. ................ | 437/195 |
| 5,741,626 A | 4/1998 | Jain et al. .................... | 430/314 |
| 5,783,485 A | 7/1998 | Ong et al. .................... | 438/637 |
| 5,877,075 A | 3/1999 | Dai et al. ..................... | 438/597 |
| 5,877,076 A | 3/1999 | Dai .............................. | 438/597 |
| 5,882,996 A | 3/1999 | Dai .............................. | 438/597 |
| 5,897,375 A | 4/1999 | Watts et al. ................. | 438/693 |
| 5,920,790 A | 7/1999 | Wetzel et al. ............... | 438/618 |
| 5,926,732 A | 7/1999 | Matsuura ..................... | 438/622 |
| 5,939,334 A | 8/1999 | Nguyen et al. ............. | 438/689 |
| 5,939,788 A | 8/1999 | McTeer ....................... | 257/751 |
| 5,960,270 A | 9/1999 | Misra et al. ................. | 438/197 |
| 5,989,997 A | 11/1999 | Lin et al. ..................... | 438/622 |
| 6,001,730 A | 12/1999 | Farkas et al. ................ | 438/627 |
| 6,016,000 A | 1/2000 | Moslehi ....................... | 257/522 |
| 6,030,904 A | * | 2/2000 | Grill et al. ................... 438/781 |

* cited by examiner

Primary Examiner—Charles Bowers
Assistant Examiner—Craig Thompson
(74) Attorney, Agent, or Firm—Robert A. Rodriguez

(57) ABSTRACT

In accordance with embodiments of the present invention a trench-level dielectric film (26) and a via-level dielectric film (24) are formed overlying a semiconductor device substrate (10). A via opening (42) is etched in the trench-level dielectric film with a first etch chemistry that has a higher etch selectivity to the trench-level dielectric film (26) than to the via-level dielectric film (24). A trench opening (54) is patterned in a photoresist layer (52) overlying the trench-level dielectric film (26). The via-level dielectric film (24) is etched with a second etch chemistry to extend the via opening (42) into the via-level dielectric film (24). The trench-level dielectric film (26) is etched to form a trench opening.

21 Claims, 5 Drawing Sheets

METHOD FOR FORMING A SEMICONDUCTOR DEVICE

This application is a continuation of U.S. patent application Ser. No. 09/104,849, filed on Jun. 25, 1998, now U.S. Pat. No. 6,127,258 which is hereby incorporated by reference, and priority thereto for common subject matter is hereby claimed.

FIELD OF THE INVENTION

The present invention relates generally to a process for forming a semiconductor device, and more particularly, to a process for forming an interconnect structure in a semiconductor and its method of formation.

BACKGROUND OF THE INVENTION

Semiconductor devices are continuing to being scaled to smaller dimensions. As the size of interconnects making up the various levels of the semiconductor devices continue to decrease, so to does the spacing between them. The combination of smaller linewidths and spacing introduces new problems with respect to the interconnect's resistance and capacitance. The smaller linewidth dimensions increases the resistance (R) of the conductive lines. The reduction in spacing between conductive lines increases the capacitance (C) between them. The associated resistance-capacitance (RC) coupling introduces problems with respect to propagation delay, crosstalk noise, and power dissipation of the device circuitry.

Copper interconnect technology and low dielectric constant (low-k) materials are two areas currently being developed by semiconductor device manufacturers in an effort to overcome the problems associated with increasing resistance and capacitance. The dielectric constant of a material separating two conducting films directly impacts the interconnect capacitance of a semiconductor device. To address these problems, new materials having lower dielectric constants are being investigated to replace dielectric films commonly used in semiconductor device fabrication. Air has a dielectric constant, or k value equal to one, and is considered to be the perfect insulator. Commonly used silicon dioxide ($SiO_2$), by comparison, has a dielectric constant of approximately 4.2. For the purposes of this specification, a low-k material for use as a semiconductor insulator is any material having a dielectric constant less than approximately 3.5.

In one particular interconnect scheme, a dual inlaid structure is formed. After forming a first interconnect level, an interlevel dielectric (ILD) layer having a dual inlaid opening is formed. One technique in the prior art uses three relatively high dielectric constant hardmask films with low-k dielectric films layered between them. The dual inlaid structure is formed by opening a via and a trench in the dielectric films using a "via first, trench last" or "trench first, via last" processing sequence. Following these steps, an interconnect structure is formed within the trench and the via opening.

One problem with the prior art includes its use of chemically vapor deposited silicon nitride materials, including plasma enhanced silicon nitride or silicon oxynitride compounds to form a hardmask film that separates the low-k dielectric films. These materials have a relatively high dielectric constant (i.e., greater than five) that increases the total dielectric constant of the ILD layer and raises the line-to-line capacitance within the device. Additionally, the use of multiple hardmask films further complicates the manufacturing process by requiring additional film depositions and etch processes to be incorporated into the process flow in order to manufacture the semiconductor device.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION OF THE DRAWINGS

In accordance with embodiments of the present invention a trench-level dielectric film and a via-level dielectric film are formed overlying a semiconductor device substrate. A via opening is etched in the trench-level dielectric film with a first etch chemistry that has a higher etch selectivity to the trench-level dielectric film than to the via-level dielectric film. A trench opening is patterned in a photoresist layer overlying the trench-level dielectric film. The via-level dielectric film is etched with a second etch chemistry to extend the via opening into the via-level dielectric film. The trench-level dielectric film is etched to form a trench opening.

Figure 1:
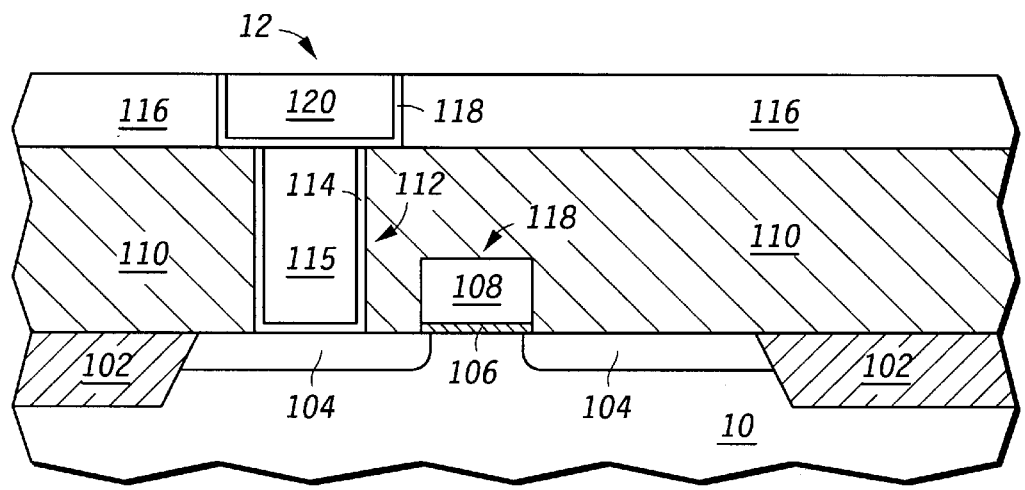
FIG. 1 includes an illustration of a cross-sectional view of a portion of a semiconductor device substrate after forming a first interconnect layer.

FIG. 1 includes an illustration of a semiconductor device that has been partially processed to define a first interconnect level. The semiconductor device comprises a semiconductor device substrate 10, field isolation regions 102, a transistor 118, conductive plug 112, and a dielectric layer 110. Transistor 118 comprises doped regions 104, a gate dielectric layer 106, and a gate electrode 108. As used in this specification, the semiconductor device substrate 10 comprises a monocrystalline semiconductor wafer, a semiconductor-on-insulator substrate, or any other substrate used to form a semiconductor device.

In one embodiment, the gate electrode 108 is a layer of polysilicon. Alternatively, gate electrode 108 may be a metal layer, such as tungsten or molybdenum, a metal nitride layer, such as titanium nitride or tungsten nitride, or a combination thereof. In addition, gate electrode 108 may be a polycide layer comprising a metal silicide, such as tungsten silicide, titanium silicide, or cobalt silicide, overlying a polysilicon layer.

Following formation of the gate electrode 108, a first interlevel dielectric (ILD) layer 110 is formed over the substrate 10 and patterned to form a contact opening. In one embodiment, first ILD layer 110 is a layer of plasma deposited oxide that is formed using tetraethoxysilane (TEOS) as a source gas. Alternatively, first ILD layer 110 may be a layer of silicon nitride, a layer of phosphosilicate glass (PSG), a layer of borophosphosilicate glass (BPSG), a silicon oxynitride layer, a polyimide layer, a low-k dielectric, or a combination thereof.

Following patterning, a contact opening is formed in the dielectric layer 110. The contact opening comprises a conductive plug 112 that is formed using an adhesion/barrier film 114, such as titanium/titanium nitride (Ti/TiN), tantalum/tantalum nitride (Ta/TaN), and the like, and a conductive fill material 115, such as tungsten. After being deposited, portions of the conductive fill material 115 and underlying adhesion/barrier film 114 are removed using a conventional etching or chemical-mechanical polishing technique to form the conductive plug 112. Alternatively, the conductive plug 112 may be formed using doped silicon as a contact fill material with or without the barrier film 114.

After forming the conductive plug 112, a dielectric film 116 is then formed overlying portions of the ILD layer 110 and the first conductive plug 112. A second adhesion/barrier film 118, and a second conductive film 120 are formed within the portions dielectric film 116 and electrically connect with portions of the conductive plug 112. In one embodiment, the second adhesion/barrier film 118 is formed using Ta/TaN and the conductive film 120 is formed using copper, aluminum, or the like. The combination of the second adhesion/barrier film 118 and the second conductive film 120 form the first interconnect level 12. Up to this point in the process, conventional methods have been used to form the device-as shown in FIG. 1.

Figure 2:
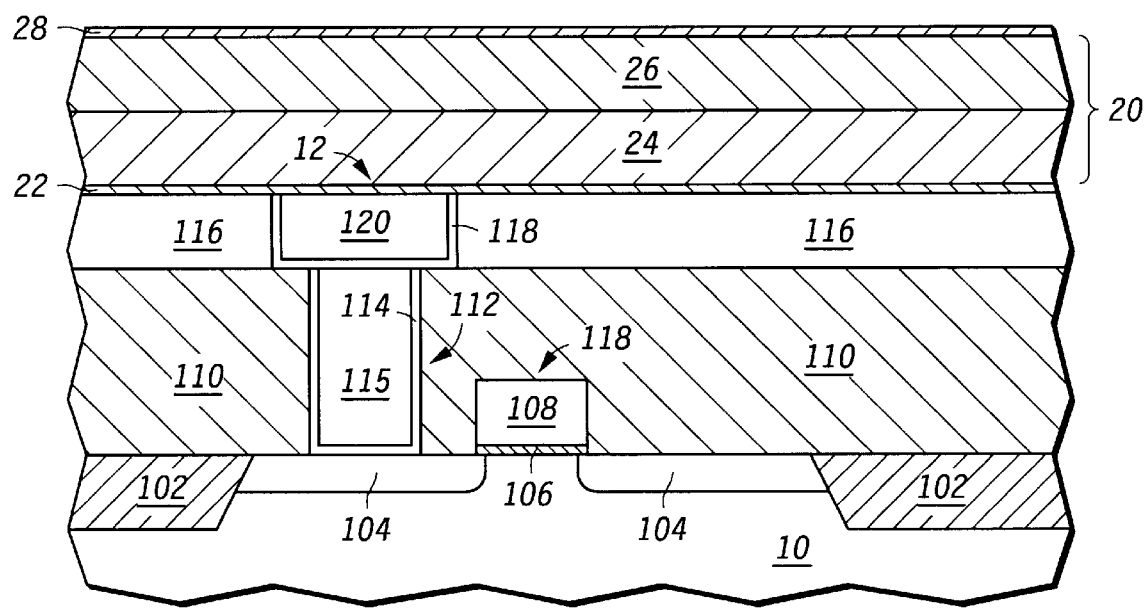
FIG. 2 includes an illustration of a cross-sectional view of the substrate of FIG. 1 after forming an interlevel dielectric (ILD) layer overlying the first interconnect layer in accordance with an embodiment of the present invention.

After forming the first interconnect level 12, in accordance with an embodiment of the present invention, an upper ILD layer 20 is then formed as illustrated in FIG. 2. ILD layer 20 comprises capping layer 22, bottom dielectric film 24, upper dielectric film 26 and hardmask film 28. In one embodiment, the capping layer 22 includes a layer of plasma enhanced nitride (PEN) deposited to a thickness in a range of approximately 40–60 nanometers. Alternatively, the capping layer 22 may comprise silicon oxynitride, boron nitride, or the like. Overlying the capping layer 22 is a bottom (via-level) dielectric film 24. In accordance with an embodiment of the present invention, bottom dielectric film 24 is formed using fluorinated tetraethoxysilane (FTEOS) as a source gas. Alternatively; bottom dielectric film 24 may be formed using alternate inorganic materials such as an oxide formed using TEOS, a silsesquioxane material, a porous oxide material, and the like. In one embodiment, bottom dielectric film 24 is formed at a thickness in a range of approximately 500–700 nanometers. Overlying bottom dielectric film 24 is upper (trench-level) dielectric film 26. Upper dielectric film 26 may be formed using spin-on coating or chemical vapor deposition (CVD) processes. The upper dielectric film 26 is formed at a thickness in a range of approximately 300–500 nanometers. The upper dielectric film 26 may be formed using an organic low-k material such as a polyimide, a biscyclobutene, a fluorocarbon, a polyarylether-based material, a spin on glass, a porous oxide material such as aerogel or xerogel, a parylene, a polysiloxane material, a silsesquioxane material, a carbon containing silicon oxide, or the like. In addition, a combination of the foregoing materials may also be used to form the upper dielectric film 26.

Overlying upper dielectric film 26 is hardmask film 28. Hardmask film 28 is formed at a thickness in a range of approximately 40–60 nanometers. In one embodiment, hardmask film 28 includes a layer of plasma enhanced nitride (PEN), which is formed using conventional plasma deposition techniques. Alternatively, the hardmask film 28 may be formed using silicon oxynitride, boron nitride, or the like.

Figure 3:
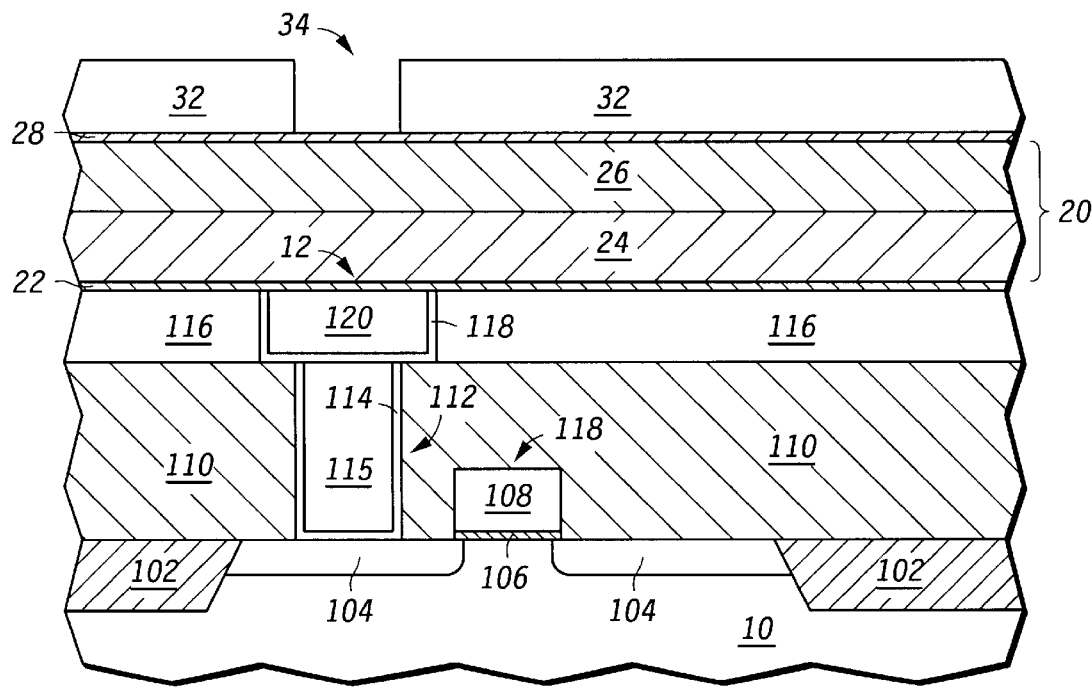
FIG. 3 includes an illustration of a cross-sectional view of FIG. 2 after forming a via opening in a resist layer overlying the ILD layer.

FIG. 3 includes an illustration of a cross-sectional view of FIG. 2 after forming a via opening 34 in a resist layer 32 overlying the ILD layer 20. The via opening will be used to define a via portion of a dual inlaid interconnect structure in the ILD layer 20.

Figure 4:
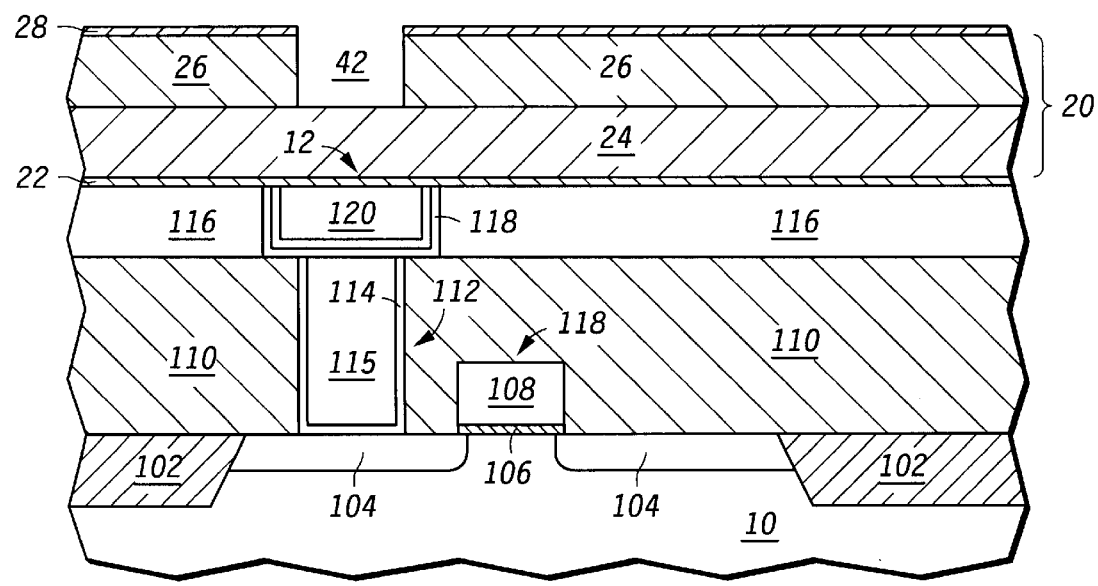
FIG. 4 includes an illustration of a cross-sectional view of the substrate of FIG. 3 with a via opening defined through a hardmask film and an upper dielectric film.

FIG. 4 includes an illustration of the substrate of FIG. 3, and now includes an opening 42 formed in an upper portion of the ILD layer 20. The opening 42 extends through the upper hardmask film 28, through the upper dielectric film 26, and terminates on or in a portion of bottom dielectric film 24. During the first step of the etching process to define the opening, the patterned substrate as illustrated in FIG. 3 can be etched using a conventional fluorine-based plasma etch process to remove exposed portions of the hardmask film 28. After removing exposed portions of the hardmask film 28, the etch process can be changed to a predominantly oxygen-containing plasma chemistry. Portions of the upper dielectric film 26 exposed to the plasma are anisotropically etched to form an opening 42 as illustrated in FIG. 4. The etch can be performed using a timed or endpointed etch process and continues until portions of bottom dielectric film 24 are exposed at the bottom of the opening 42. Because the etch chemistry used to, etch the upper dielectric film 26 contains oxygen, the photoresist layer 32 is also being removed at the same time the opening 42 is being formed. Additionally, because the bottom dielectric film 24 is formed using an inorganic material, the etch selectivity between the upper dielectric film 26 and the bottom dielectric film 24 is such that only a minimal amount of the bottom dielectric film 24 is removed during this etch processing step.

Figure 5:
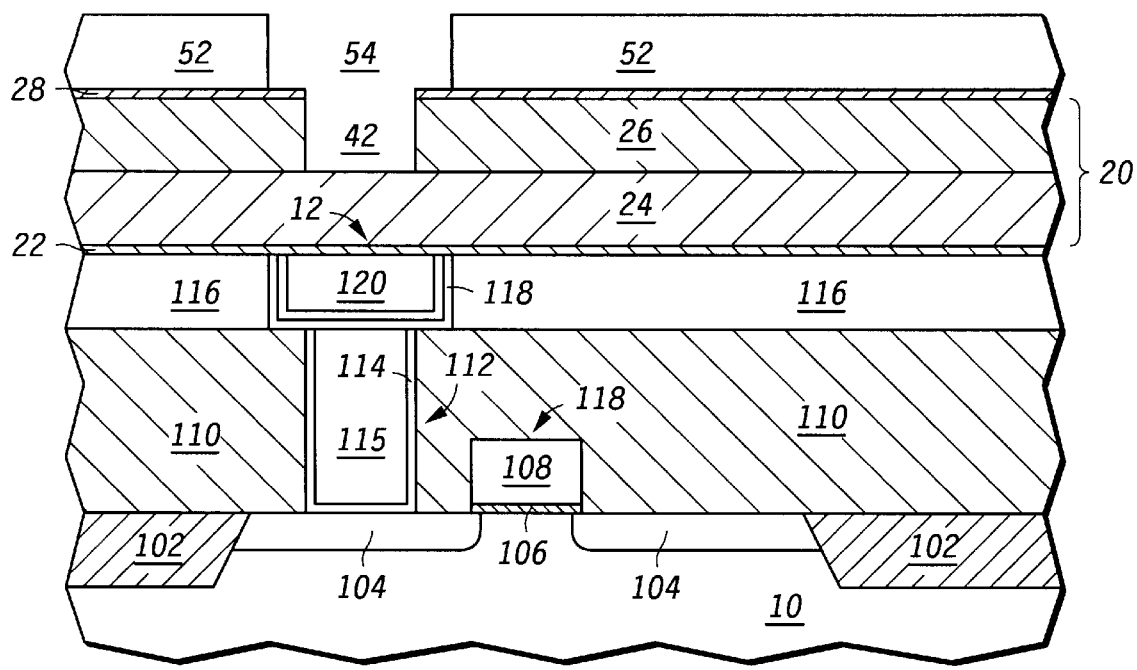
FIG. 5 includes an illustration of a cross-sectional view of the substrate of FIG. 4 after forming a trench opening in a resist layer overlying the ILD layer.

In FIG. 5, in accordance with an embodiment of the present invention, a photoresist layer 52 is formed overlying hardmask film 28. A portion of the photoresist layer 52 is patterned to form an opening 54 that will be used to define a trench portion of a dual inlaid interconnect opening as will be explained further in FIGS. 6–7.

Figure 6:
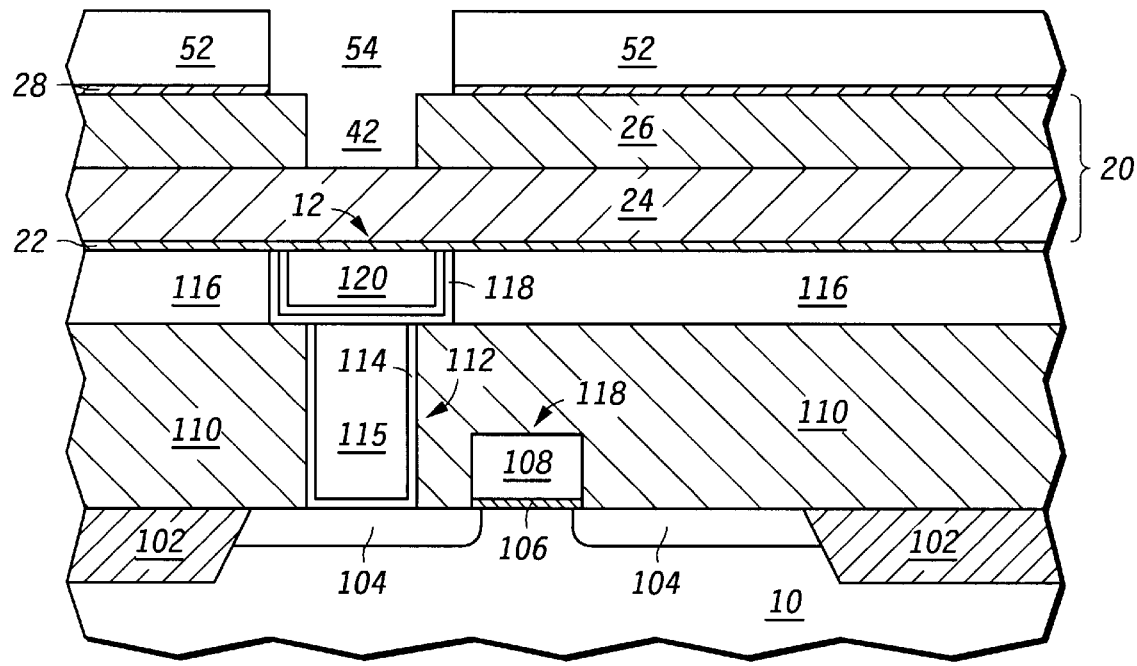
FIG. 6 includes an illustration of a cross-sectional view of the substrate of FIG. 5 after removing a portion of the hardmask film.

FIG. 6 includes an illustration of a cross-sectional view of the substrate of FIG. 5 after removing a portion of the hardmask film 28. The hardmask film 28 is etch using a conventional fluorine-based plasma etch process. The etch is typically a timed etch and targets to completely remove the entire thickness of exposed portions of the hardmask film 28. The portions of the hardmask film 28 that are removed are subsequently used to define the trench portion of the dual inlaid interconnect. The via opening, which is subsequently etched in bottom dielectric film 24, corresponds to those patterns currently defined by etched portions of upper dielectric film 26 (opening 42).

Figure 7:
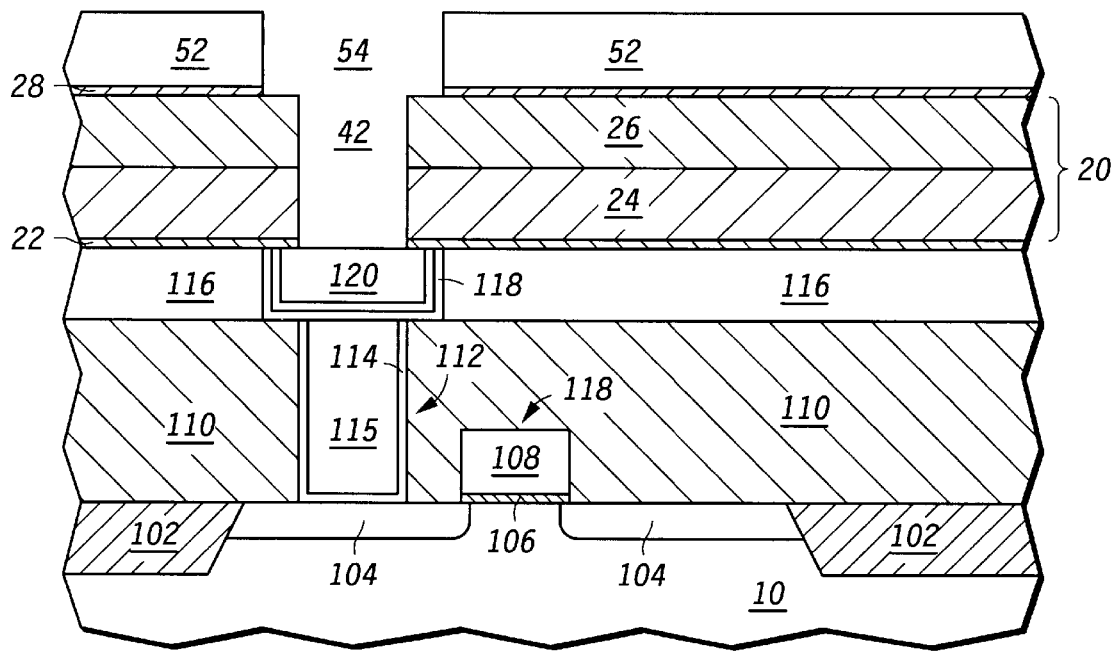
FIG. 7 includes an illustration of a cross-sectional view of the substrate of FIG. 6 after forming a via opening in a lower dielectric film in accordance with an embodiment of the present invention.

FIG. 7 includes an illustration of a cross-sectional view of the substrate of FIG. 6 after performing an etch processing step to remove portions of the bottom dielectric film 24 and the capping layer 22 that define the via portion of the dual inlaid interconnect opening. In an alternative embodiment, the capping layer 22 is left to remain over interconnect 12 and is removed during subsequent processing steps. The etch is performed using a processing chemistry exhibiting good selectivity to the upper dielectric film 26. This ensures the vertical sidewall integrity of the via is maintained during the etch processing step.

In one embodiment, the etch uses a fluorine-based reactive ion etch (RIE) process chemistry performed at pressure in a range of approximately 1–10 millitorr and using an applied radio frequency (RF) power in a range of approximately 800–1200 watts, depending on the type of etching reactor used. The other etch processing parameters are conventional. The fluorine-to-carbon ratio is selected so as to provide an etch selectivity greater than approximately 6:1 between the lower dielectric film 24 and the upper dielectric film 26. This allows the via pattern 42 to be reproduced in the lower dielectric film 24.

Figure 8:
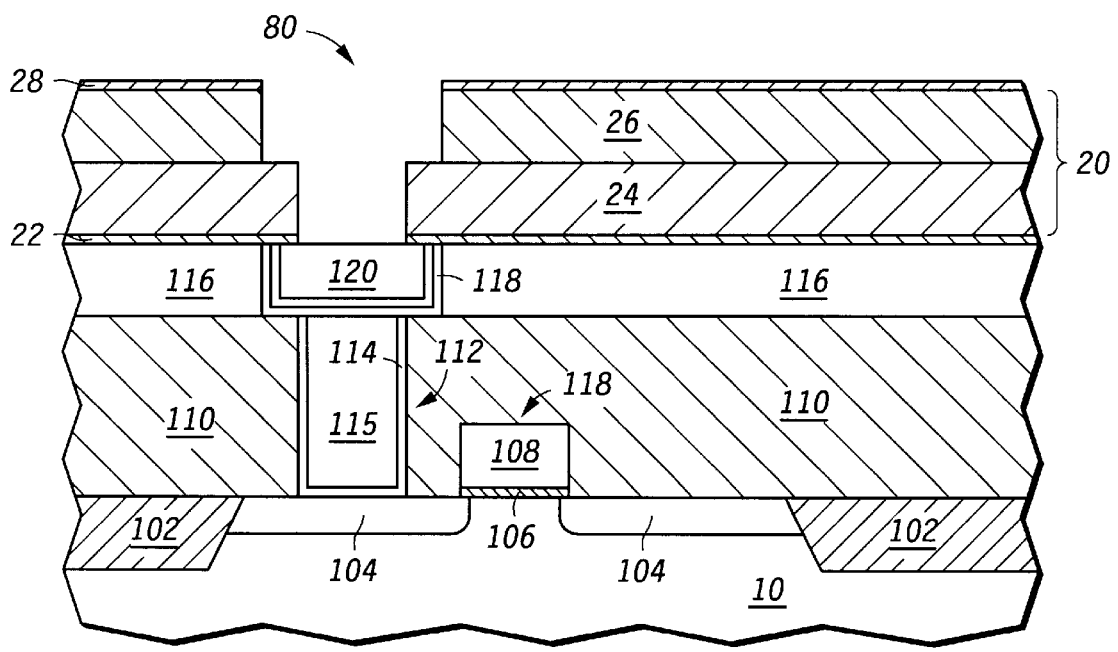
FIG. 8 includes an illustration of a cross-sectional view of the substrate of FIG. 7 after forming a dual inlaid opening in accordance with an embodiment of the present invention.

In FIG. 8, portions of the upper dielectric film 26 defined by the hardmask film 28 and the photoresist layer 52 have been removed to form the trench portion of the dual inlaid interconnect opening 80. After completion of the via etch portion of the dual inlaid interconnect opening as illustrated by FIG. 7, the processing chemistry is changed to an oxygen-containing plasma. In one embodiment the etch process is performed at pressure in a range of approximately 1–10 millitorr and at an applied (RF) power in a range of approximately 100–300 watts, depending on the type of etching reactor used. The other etch processing parameters are conventional. Fluorine-containing and carbon-containing gasses may be added to improve the profile control and film selectivities. An etch processing chemistry having a etch selectivity of greater than approximately 50:1 between the upper dielectric film 26 and the hardmask film 28 will adequately reproduce the trench opening in the upper dielectric film 26.

The presence of oxygen, during the etch processing step, removes the photoresist layer 52 while the upper dielectric film 26 is being etched. The etch selectivity to the bottom dielectric film 24 is such that the bottom dielectric film 24 is not substantially etched and the via sidewall profile is relatively unchanged. Therefore, the sidewall profile of the via is maintained during this processing step. At this point, in accordance with an embodiment of the present invention, a substantially completed dual inlaid opening 80 has been formed.

Figure 9:
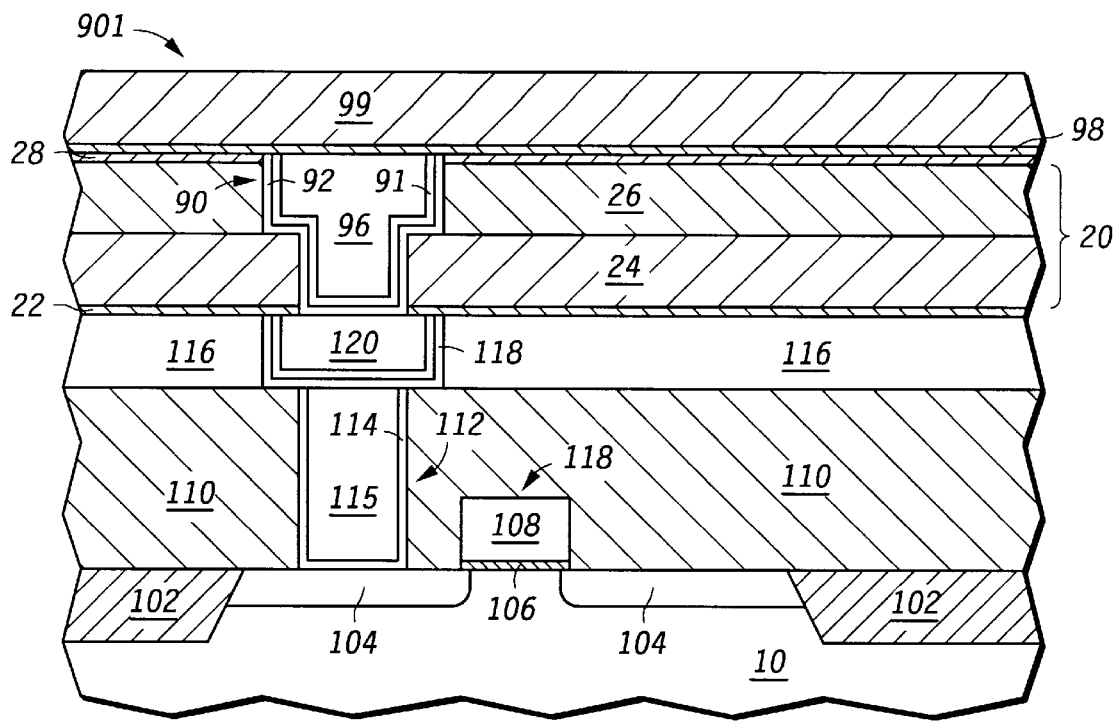
FIG. 9 includes an illustration of a cross-sectional view of the substrate of FIG. 8 after forming a substantially completed device.

In FIG. 9, an adhesion/barrier layer 92 is formed within the dual inlaid opening 80 and overlying ILD layer 20. In one embodiment adhesion/barrier layer 92 is a layer of tantalum nitride. Alternatively, adhesion/barrier layer 92 may be a layer of titanium nitride, a layer of tungsten nitride, a layer of tantalum silicon nitride, a layer of tantalum, a titanium tungsten layer or the like. Adhesion/barrier layer 92 may be deposited using conventional sputtering or chemical vapor deposition (CVD) techniques. A conductive seed layer 91 is formed overlying adhesion/barrier layer 92 using conventional deposition techniques. A conductive film 96 is then formed overlying the conductive seed layer 94. The conductive film 96 has a thickness that is sufficient to completely fill dual inlaid opening 80. In one embodiment, the conductive film 96 is a layer of copper, deposited using a conventional electroplating process. Alternatively, the conductive film 96 may be formed using other techniques including electroless plating, chemical vapor deposition (CVD), or physical vapor deposition (PVD) and using other materials including aluminum, silver, tungsten, and the like.

Portions of the conductive film 96, conductive seed layer 91, and adhesion/barrier layer 92 are subsequently removed to form a conductive interconnect 90 within the dual inlaid opening, where the conductive interconnect 90 comprises remaining portions of the conductive film 96, the conductive seed layer 91, and the adhesion/barrier layer 92. The conductive interconnect 90 may be formed using a chemical mechanical polishing process. Alternatively, the conductive interconnect 90 may be formed using conventional etching techniques, such as ion beam milling, reactive ion beam etching, and plasma etching, or using a combination of etching and polishing techniques.

A capping layer 98 is then formed overlying the conductive interconnects 96. In one embodiment, capping layer 98 is a layer of plasma deposited silicon nitride. Alternatively, capping layer 98 may be a layer of plasma deposited silicon oxynitride, a layer of boron nitride or the like. The capping layer 98 is used to reduce the likelihood of metal atoms within conductive interconnect 90 from diffusing into dielectric layers which are subsequently deposited over the conductive interconnect 90. A passivation layer 99 is then formed overlying the capping layer 98. At this point, a substantially completed device 901 has been formed. Other electrical connections are made but not shown in FIG. 9. Also, other ILD layers and interconnect levels may be used as needed, if a more complicated device is formed.

Embodiments of the present invention may be changed as necessary in order to properly apply the concepts discussed above in order to accommodate variations of the present invention. For example, after defining the via pattern in the hardmask film 28 and the upper dielectric film 26 as illustrated in FIG. 4, an alternative processing scheme may be incorporated in order to facilitate reworking of the substrate in the event problems are encountered during photoresist patterning to define the trench opening as is illustrated in FIG. 5.

Figure 10:
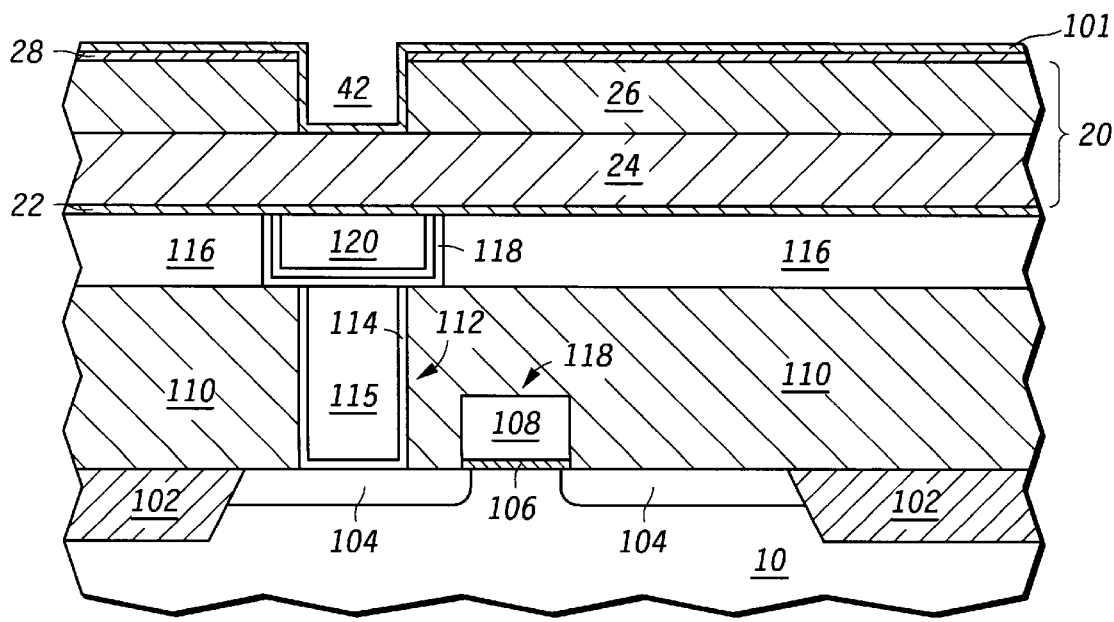
FIG. 10 includes an illustration of a cross-sectional view of the substrate of FIG. 5 after forming an inorganic protective layer overlying the substrate in accordance with an embodiment of the present invention.

In an alternate embodiment, after the opening 42 is formed, a thin silicon-containing inorganic layer 101 is formed overlying the hardmask layer and within the opening 42 as illustrated in FIG. 10. The thin inorganic layer 101 serves to protect the upper dielectric film 26 if the photoresist layer 52 illustrated in FIG. 5 requires removal using a solvent, an acid, or an oxygen-containing plasma chemistry that would also remove exposed-portions of upper dielectric film 26. In one embodiment, the silicon-containing inorganic layer 101 is a layer of plasma deposited silicon nitride. Alternatively, layer 101 may be a layer of plasma deposited silicon oxynitride, a layer of boron nitride, a layer of silicon dioxide, or the like. The layer 101 is formed sufficiently thin, in a range of approximately 40–60 nanometers, so as not to significantly impact the critical dimensions of the opening. Subsequent processing steps to form the dual inlaid opening 90 are essentially the same as those previously described in FIGS. 5–8.

Embodiments of the present invention include many benefits. First, embodiments of the present invention reduce the need to use a high dielectric constant etch stop film between the bottom dielectric film 24 and the upper dielectric film 26. Because the etch stop film is eliminated, there is- a corresponding lower overall dielectric constant for ILD layer 20 as compared to an ILD layer that uses an intermediate etch stop, such as a PEN or silicon oxynitride etch stop layer. Additionally, this process can be easily integrated into a process flow without significantly deviating from current conventional manufacturing methods. Further, the process can be used without having to develop marginal processing steps or creating exotic materials that are not currently available.

In the foregoing specification, the invention has been described with reference to specific embodiments. However, one or ordinary skill in the art appreciates that various modifications and changes can be made without departing from the skill of the present invention as set forth in the claims below. Accordingly, the specification and figures are to be regarded in an illustrative rather than a restrictive sense, and all such modifications are intended to be included within the scope of the present invention. In the claims, means plus function clauses if any cover the structures described herein that perform the recited functions. The means plus function clauses also cover structural equivalents and equivalent structures that perform the recited functions.

What is claimed is:

1. A method of forming a semiconductor device, comprising:
    forming an opening that exposes a portion of an organic low dielectric constant material overlying a semiconductor substrate;
    forming an inorganic material over the portion of the organic low dielectric constant material;
    forming a first resist layer over the inorganic material;
    patterning a resist feature that exposes a portion of the inorganic material; and
    removing unpatterned portions of the inorganic material and organic low dielectric constant material defined by the resist feature.

2. The method of claim 1, wherein the organic low dielectric constant material includes a material selected from a group consisting of a polyimide, a biscyclobutene, a fluorocarbon, a parylene, and a polyarylether-based material.

3. The method of claim 1, further comprising:
    removing the first resist layer; and
    forming a second resist layer, prior to removing portions of the inorganic material.

4. The method of claim 1, wherein the inorganic material is further characterized as a silicon-containing inorganic layer.

5. The method of claim 1, wherein the inorganic material includes a material selected from a group consisting of silicon nitride, silicon oxynitride, boron nitride, and silicon dioxide.

6. The method of claim 1, wherein a thickness of the inorganic material is in a range of approximately 40–60 nanometers.

7. The method of claim 1, wherein the portion of the organic low dielectric constant material includes a sidewall portion of an opening formed in the organic low dielectric constant material.

8. A method of forming a semiconductor device, comprising:
    forming an opening that exposes a portion of a carbon-containing dielectric material overlying a semiconductor substrate;
    forming an inorganic material over the portion of the carbon-containing dielectric material;
    forming a first resist layer over the inorganic material;
    patterning a resist feature that exposes a portion of the inorganic material; and
    removing portions of the inorganic material and carbon-containing dielectric material defined by the resist feature.

9. The method of claim 8, wherein the carbon-containing dielectric material includes a material selected from a group consisting of polysiloxane, a porous oxide material, and a carbon-containing silicon oxide.

10. The method of claim 9, wherein the porous oxide material includes a material selected from a group consisting of aerogel and xerogel.

11. The method of claim 8, further comprising:
    removing the first resist layer; and
    forming a second resist layer, prior to removing portions of the inorganic material.

12. The method of claims 8, wherein the inorganic material is further characterized as a silicon-containing inorganic layer.

13. The method of claim 8, wherein the inorganic material includes a material selected from a group consisting of silicon nitride, silicon oxynitride, boron nitride, and silicon dioxide.

14. The method of claim 8, wherein a thickness of the inorganic material is in a range of approximately 40–60 nanometers.

15. The method of claim 8, wherein the portion of the carbon-containing dielectric material includes a sidewall portion of an opening formed in the carbon-containing dielectric material.

16. A method of forming a semiconductor device, comprising:
    forming an opening that exposes a portion of a dielectric material selected from a group consisting of a spin on glass and a silsesquioxane overlying a semiconductor substrate;
    forming an inorganic material over the portion of the dielectric material selected from a group consisting of a spin on glass and a silsesquioxane;
    forming a first resist layer over the inorganic material;
    patterning a resist feature that exposes a portion of the inorganic material; and
    removing unpatterned portions of the inorganic material and the dielectric material selected from a group consisting of a spin on glass and a silsesquioxane defined by the resist feature.

17. The method of claim 16, further comprising:
    removing the first resist layer; and
    forming a second resist layer, prior to removing portions of the inorganic material.

18. The method of claim 16, wherein the inorganic material is further characterized as a silicon-containing inorganic layer.

19. The method of claim 16, wherein the inorganic material includes a material selected from a group consisting of silicon nitride, silicon oxynitride, boron nitride, and silicon dioxide.

20. The method of claim 16, wherein a thickness of the inorganic material is in a range of approximately 40–60 nanometers.

21. The method of claim 16, wherein the portion of the dielectric material selected from a group consisting of a spin on glass and a silsesquioxane includes a sidewall portion of an opening formed in the dielectric material selected from a group consisting of a spin on glass and a silsesquioxane.

* * * * *